United States Patent

Seo et al.

Patent Number: 5,959,936
Date of Patent: Sep. 28, 1999

[54] COLUMN SELECT LINE ENABLE CIRCUIT FOR A SEMICONDUCTOR MEMORY DEVICE

[75] Inventors: Dong-il Seo, Yongin; Tae-seong Jang, Suwon, both of Rep. of Korea

[73] Assignee: Samsung Electronics, Co., Ltd., Suwon, Rep. of Korea

[21] Appl. No.: 08/977,187

[22] Filed: Nov. 24, 1997

[30] Foreign Application Priority Data

Nov. 30, 1996 [KR] Rep. of Korea ............... 96-60507

[51] Int. Cl.$^6$ .................................................. G11C 8/00
[52] U.S. Cl. .................... 365/233; 365/194; 365/189.06
[58] Field of Search .................... 365/233, 194, 365/230.06

[56] References Cited

U.S. PATENT DOCUMENTS

| | | | |
|---|---|---|---|
| 5,031,150 | 7/1991 | Ohsawa | 365/193 |
| 5,414,672 | 5/1995 | Ozeke et al. | 365/233.5 |
| 5,703,828 | 12/1997 | Park et al. | 365/230.03 |

*Primary Examiner*—David Nelms
*Assistant Examiner*—Hoai V. Ho
*Attorney, Agent, or Firm*—Marger Johnson & McColom, P.C.

[57] ABSTRACT

A column select line enable circuit prevents the first bit in a sequence of output data from being missed, thereby reducing tRCD in a synchronous memory device. The circuit delays a predetermined period of time after a row active command is applied to the memory device and then activates a column select enable line regardless of the state of the system clock signal. The column select enable line is maintained in an active state for a second period of time to allow the first bit of data to be read from the device. Thereafter, the column select enable line is enabled and disabled responsive to the system clock signal to read the remaining bits in the sequence of output data in a conventional manner. In a preferred embodiment, the circuit does not enable the column select enable line unless a decoded bank address signal is active.

11 Claims, 8 Drawing Sheets

ROW ACTIVE COMMAND (BANK A)   READ COMMAND (BANK A)

COLUMN SELECT LINE ENABLE CIRCUIT FOR A SEMICONDUCTOR MEMORY DEVICE

This application corresponds to Korean patent application No. 96-60507 filed Nov. 30, 1996 in the name of Samsung Electronics Co., Ltd., which is herein incorporated by reference for all purposes.

BACKGROUND OF THE INVENTION

1. Field of the Invention

This invention relates generally to semiconductor memory devices and more particularly to a column select line enable circuit for a semiconductor memory device.

2. Description of the Related Art

In a synchronous dynamic random access memory (SDRAM), row active commands and read/write commands are input in synchronization with a system clock, as are various other commands for executing functions of the SDRAM. Input/output operations occur at either the rising edge or the falling edge of the system clock depending on the design of the particular SDRAM.

Although signals applied to an SDRAM from outside the chip are synchronized with the system clock, the internal circuitry within the SDRAM is divided into a clock-synchronous portion and a clock-asynchronous portion. The clock-synchronous portion is further sub-divided into a portion operating in synchronization with an externally applied system clock signal and a portion operating in synchronization with an internally generated clock signal. For example, whereas row address decoding, selected word line activation, or bit line sensing operations are executed asynchronously, data input/output operations of the semiconductor memory device are executed in synchronization with the clock.

A predetermined time margin is required for interfacing between the synchronous and asynchronous portions of an SDRAM. If the time margin for interface is not secured, malfunctions which reduce reliability may occur. In order to attain high-speed operation while maintaining excellent operational reliability, the required time margin known as tRCD must be reduced. The tRCD parameter (/RAS to /CAS delay) is the minimum time required form the time a row active command is input to the time a read/write command is input.

Figure 4:
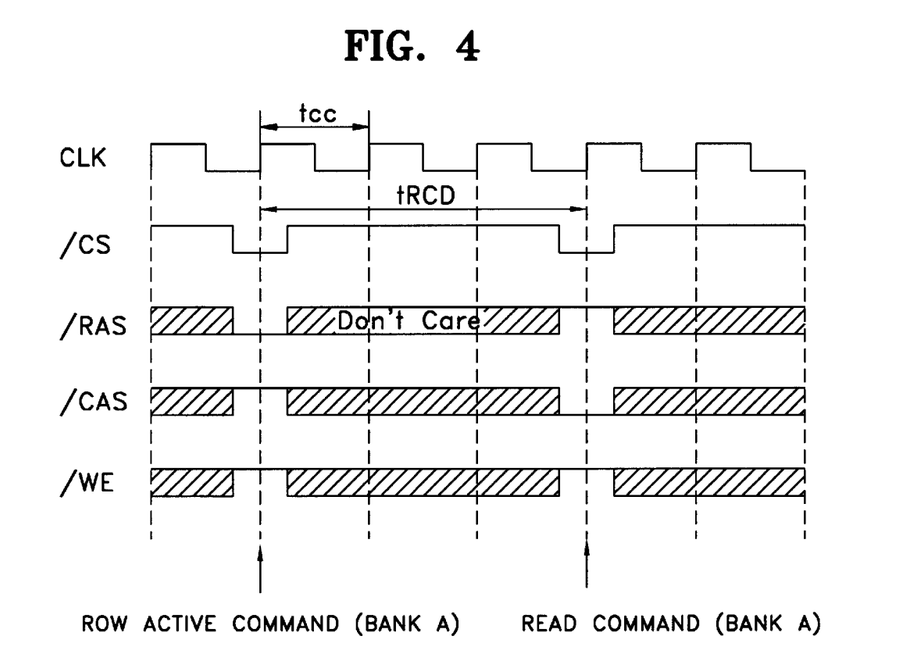
FIG. 4 is a timing diagram showing various waveforms that explain the parameter tRCD in an SDRAM device.

FIG. 4 is a timing diagram for explaining the parameter tRCD in an SDRAM device. In FIG. 4, tCC denotes the cycle time of the system clock. A chip select signal /CS, which is a "low" level active signal, is input to a semiconductor memory device at the rising edge of the system clock CLK. A row address strobe signal /RAS, a column address strobe signal /CAS, and a write enable signal /WE, all of which are active "low", are input at the rising edge of the system clock CLK.

A row active command and a read command are carried out through a combination of the write enable signal /WE, the chip select signal /CS, the column address strobe signal /CAS and the row address strobe signal /RAS.

When the semiconductor memory device is in an idle state, the combination of a "low" level chip select signal /CS, a "low" level row address strobe signal /RAS, a "high" level column address strobe signal /CAS and a "high" level write enable signal /WE is recognized as a row active command at the rising edge of the system clock CLK.

When the semiconductor memory device is in a row active state, a "low" level chip select signal /CS, "high" level row address strobe signal /RAS, "low" level column address strobe signal /CAS and "high" level write enable signal /WE are recognized as a read command at the rising edge of the system clock CLK.

Other combinations can also be used to implement other commands.

Figure 5:
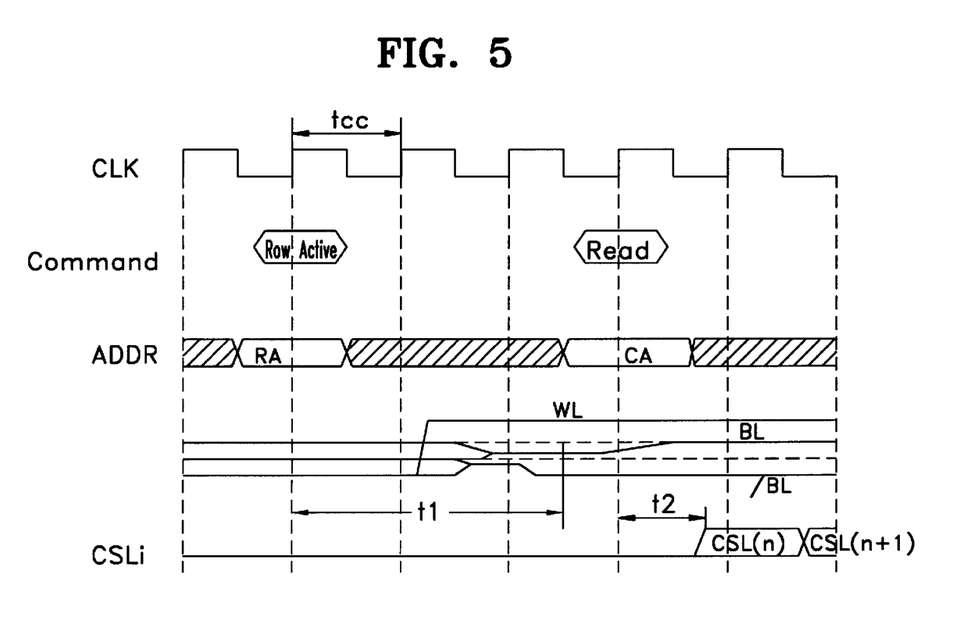
FIG. 5 is a waveform diagram showing the operation of internal signals in a synchronous DRAM device when a row active command and a read command are input to the device.

FIG. 5 is a waveform diagram showing the operation of internal signals in the semiconductor memory device when the row active command and the read command are input to the device.

When the row active command is input, a word line corresponding to a row selected according to a bank address and a row address becomes active. Then, a bit line sensing operation is executed so that a level transition on the bit line occurs. Here, t1 is the time required from the input time of the row active command to the occurrence of the bit line sensing operation, and t2 is the time from the input time of read/write command to the enabling time of a column select line. If the column select line signal CSLi becomes active prior to t1, a malfunction may occur. Thus, tRCD is determined on the basis of t1.

For example, assume the cycle time tCC of the clock is 10 ns (that is, the frequency of the clock is 100 MHz), t1 of a first semiconductor memory device "A" is 30 ns, and t2 of device A is 10 ns. Also assume that t1 of a second semiconductor memory device "B" is 31 ns, and t2 of device B is 10 ns. In this case, tRCD of device A is 2 clocks, and that of the semiconductor memory device B is 3 clocks. Then, the difference between t1 values of the semiconductor memory devices, i.e., 1ns, is equivalent to 1 clock difference between tRCD values of the semiconductor memory devices. This is because all commands are input in synchronization with the system clock CLK. In other words, the semiconductor memory device B will experience a malfunction when a read command is applied only 2 cycles after a row active command is applied.

Figure 1:
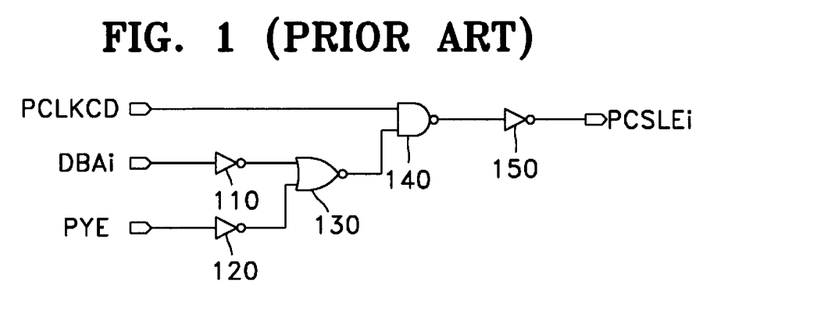
FIG. 1 is a schematic diagram of a prior art column select line enable circuit.

FIG. 1 is schematic diagram of a conventional column select line enable circuit of a semiconductor memory device. The circuit of FIG. 1 includes inverters 110, 120 and 150, a NOR gate 130, and a NAND gate 140. There is one conventional column select line enable circuit for each bank. For example, when the number of banks included in the semiconductor memory device is two, two column select line enable circuits are included.

Referring to FIG. 1, the inverter 110 inverts a decoded bank address signal DBAi. A one bit bank address is applied from outside the semiconductor memory device if there are two banks. Bank A is selected when the bank address composed of one bit is in a logic "low" level, and a bank B is selected if the bank address is in a logic "high" level. If 1-bit bank address is decoded, two decoded bank address signal are output. Of the two output signals, one corresponds to bank A, while the other corresponds to bank B. Therefore, the decoded bank address signal is activated, i.e., driven to a "high" level, only if the corresponding bank is selected.

A timing control signal PYE, which is generated internally in the semiconductor memory device, is activated at the end of a predetermined period of time (t1) which begins when a row active command is input. The period of time (t1) is the minimum amount of time required from the time the row address strobe signal /RAS becomes active until the bit line sensing operation is executed. The timing control signal PYE prevents a column line from being selected before the bit line sensing operation is executed. The inverter 120 inverts the timing control signal PYE, and the NOR gate 130 performs a logical sum operation with respect to the output of the inverter 110 and the output of the inverter 120 and then inverts the result. The NAND gate 140 receives an internal clock signal PCLKCD and the output of the NOR gate 130 as inputs. The inverter 150 inverts the output of NAND gate 140 to output a column select line enable signal PCSLEi. Therefore, the column select line enable circuit of the semiconductor memory device shown in FIG. 1 allows the internal clock PCLKCD to pass therethrough when the corresponding bank is selected and the timing control signal PYE is at a "high" level. The internal clock PCLKCD is generated internally in the chip in accordance with the system clock CLK which is applied from outside of the semiconductor memory device.

Figure 2:
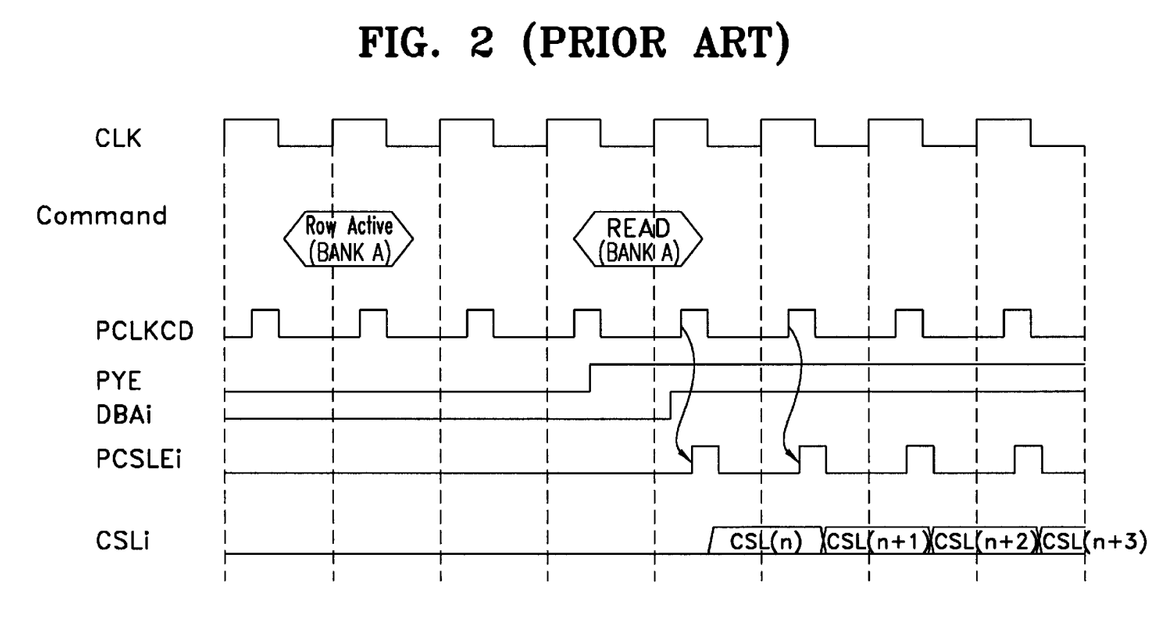
FIG. 2 is a timing diagram showing waveforms of signals in the circuit of FIG. 1 for a case in which the minimum tRCD required by the column select line enable circuit of FIG. 1 is satisfied.
Figure 3:
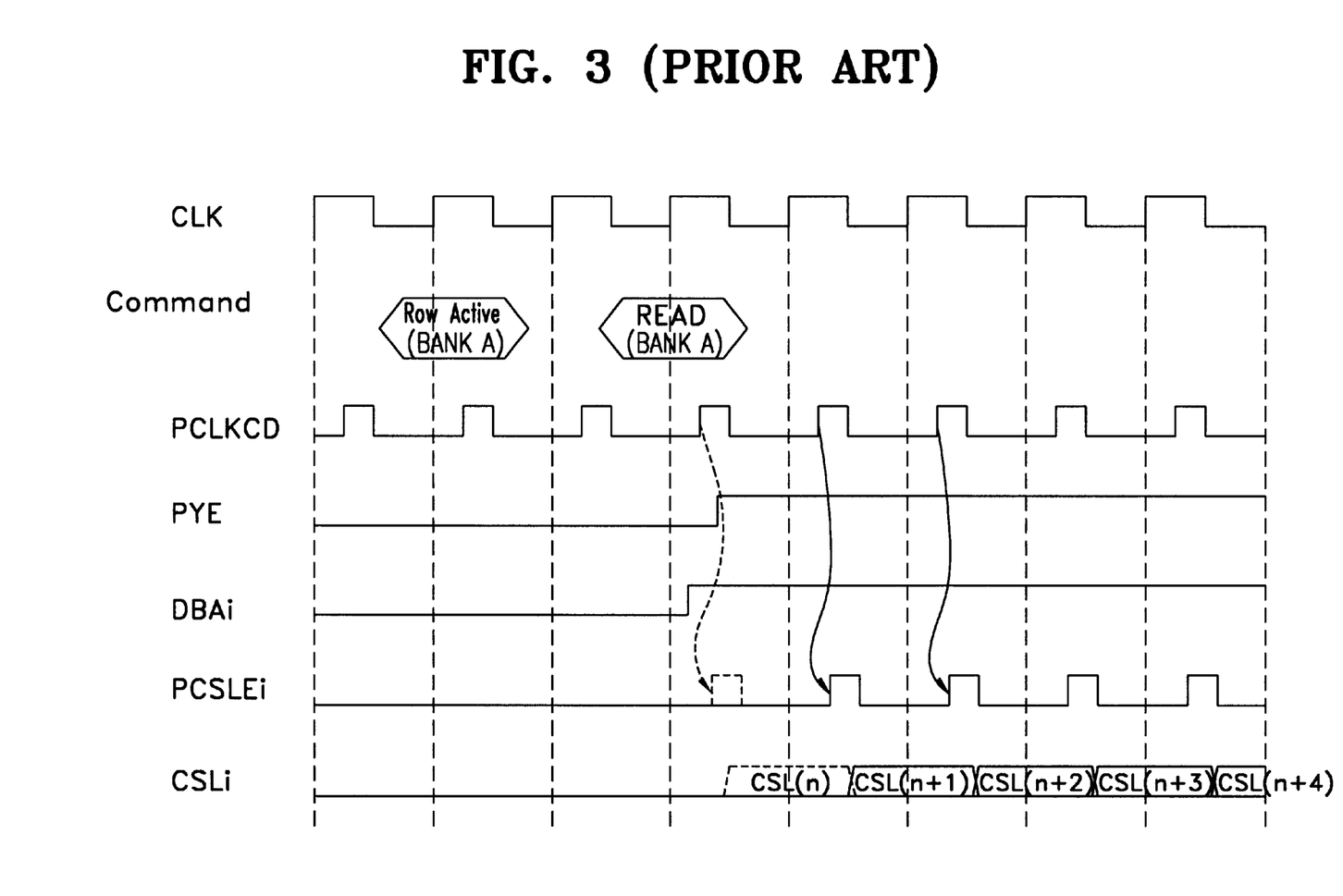
FIG. 3 is a timing diagram showing waveforms of signals in the circuit of FIG. 1 for a case in which the minimum tRCD required by the column select line enable circuit of FIG. 1 is not satisfied.

FIGS. 2 and 3 are timing diagrams showing waveform of various signals for a burst read operation in which several bits of data are read sequentially and continuously from the semiconductor memory device.

FIG. 2 is a timing diagram showing waveforms of various signals for a case in which the minimum tRCD required by the column select line enable circuit of FIG. 1 is satisfied. In FIG. 2, the internal clock PCLKCD is generated according to the system clock CLK which applied from outside of the memory device. The timing control signal PYE is activated a predetermined period of time t1 after a row active command is applied. The decoded bank address signal DBAi is activated a predetermined period of time after a read command is applied. The column select line enable signal PCSLEi undergoes level transitions in response to the internal clock PCLKCD when the timing control signal PYE and the decoded bank address signal DBAi are both at a "high" level.

FIG. 3 a timing diagram showing waveforms of various signals for a case in which the minimum tRCD required by the column select line enable circuit of FIG. 1 is not satisfied. In FIG. 3, tRCD calculated based on the predetermined period of time (t1) is 3 cycles, but the read command is applied only 2 cycles after the row active command is applied. The timing control signal PYE is triggered responsive to the row active command, and the decoded bank address signal DBAi is generated responsive to the bank address input with the read command. When the bank address is decoded, the column address is also decoded. Therefore, when the decoded bank address signal of the bank A is at a "high" level, the column select line corresponding to the pertinent column address must be activated.

However, as shown in FIG. 3, if the timing control signal PYE is inactive, even when the decoded bank address signal DBAi is activated, an active pulse corresponding to the data bit "n" is not generated in the column select line enable signal PCSLEi. Referring to FIG. 1, the timing control signal PYE is delayed by gates 120 and 130, and when t1 is too long, both inputs to gate 140 are not high at the same time, or are not both high long enough, to generate a high pulse at the output of inverter 150. In other words, when t1 is too long, PYE is not activated soon enough for clock pulse in PCLKCD to propagate through to PCSLEi. Thus, the first pulse of PCSLEi (which should have occurred at the time shown in broken lines in FIG. 3) is missed, and the first bit of data in a burst read operation is not output from the semiconductor memory device.

Accordingly, a need remains for a technique for overcoming the problems described above.

SUMMARY OF THE INVENTION

Therefore, it is an object of the present invention to improve the operating speed of a semiconductor memory device.

Another object of the present invention is to reduce the delay parameters of a semiconductor memory device.

A further object of the present invention is to improve the performance of a column select line enable circuit for a semiconductor memory device.

Another object of the present invention is to prevent the first bit in a sequence of output data from being missed when the data is read from a semiconductor memory device in burst mode.

To accomplish these and other objects, a column select line enable circuit constructed in accordance with the prevent invention prevents the first bit in a sequence of output data from being missed, thereby reducing tRCD in a synchronous memory device. The circuit delays a predetermined period of time after a row active command is applied to the memory device and then activates a column select enable line regardless of the state of the system clock signal. The column select enable line is maintained in an active state for a second period of time to allow the first bit of data to be read from the device. Thereafter, the column select enable line is enabled and disabled responsive to the system clock signal to read the remaining bits in the sequence of output data in a conventional manner. In a preferred embodiment, the circuit does not enable the column select enable line unless a decoded bank address signal is active.

One aspect of the present invention is a method of controlling a column select enable line in a synchronous memory device that is synchronized by a first clock signal, the method comprising: delaying a predetermined period of time after a row active command is applied to the memory device; and activating the column select enable line when the predetermined period of time is completed regardless of the state of the first clock signal.

Another aspect of the present invention is a method of reading a sequence of data bits from a synchronous memory device comprising: executing a bit line sensing operation responsive to a row active command; and enabling a column select line for a first bit of the sequence of data bits as soon as the bit line sensing operation is executed.

A further aspect of the present invention is a column select line enable circuit for a synchronous memory device comprising: a timing control signal generator for generating a timing control signal responsive to a row active command, wherein the timing control signal generator activates the timing control signal when a bit line sense operation is executed; a pulse generator coupled to the timing control signal generator for generating a pulse signal responsive to the timing control signal; and a logic circuit coupled to the timing control signal generator and the pulse generator for generating a column select line enable signal responsive to the timing control signal and the pulse signal; wherein the logic circuit activates the column select line enable signal when the timing control signal is active and either the pulse signal or a clock signal is active.

An advantage of the present invention is that it reduces the required delay times for a synchronous memory device, thereby increasing the operating speed.

Another advantage of the present invention is that it improves the reliability of a synchronous memory device.

The foregoing and other objects, features and advantages of the invention will become more readily apparent from the following detailed description of a preferred embodiment of the invention which proceeds with reference to the accompanying drawings.

DETAILED DESCRIPTION

Figure 6:
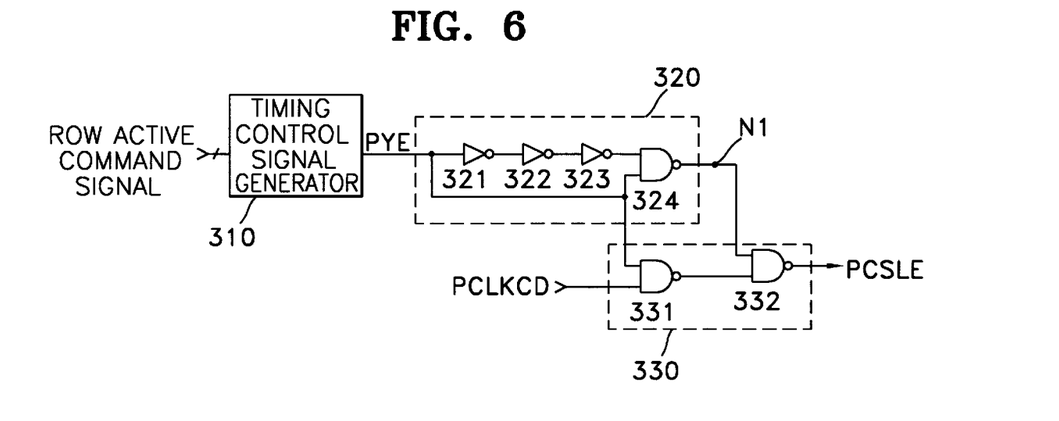
FIG. 6 is a schematic diagram of a first embodiment of a column select line enable circuit constructed in accordance with the present invention.

FIG. 6 is a schematic diagram of a first embodiment of a column select line enable circuit constructed in accordance with the present invention. The circuit shown in FIG. 6 includes a timing control signal generator 310, a pulse generator 320 and a logic unit 330.

The timing control signal generator 310 generates a timing control signal PYE responsive to a row active command signal. The row active command signal can be implemented as a combination of a write enable signal /WE, a row address strobe signal /RAS, a column address strobe signal /CAS, and a chip select signal /CS. In other words, the row active command can be detected by sensing when a predetermined combination of the above signals are applied to the semiconductor memory device according to the design specification.

The timing control signal PYE is activated a predetermined period of time (t1) after the row active command is applied. The period t1 is the time from when the row active command is applied until the time a bit line sensing operation is executed. The pulse generator 320 is triggered by the activation of the timing control signal PYE and generates a pulse which is active for a predetermined period of time. The pulse generator 320 includes a plurality of serial connected inverters 321, 322 and 323 and an NAND gate 324. The serially connected inverters delay the timing control signal PYE to generate a delayed pulse signal. The NAND gate 324 performs an AND operation on the delayed timing control signal output from the inverter 323 and the timing control signal PYE and then inverts the same. The number of serially connected inverters is preferably selected so that the pulse width of the signal generated form the pulse generator 320 is 90~110% of that of the internal clock signal PCLKCD. Reference numeral N1 denotes a node indicated by the output of the pulse generator 320.

The logic unit 330 generates a column select line enable signal PCSLE responsive to the timing control signal PYE, the output pulse signal of the pulse generator 320, and the internal clock PCLKCD which is generated internally in the semiconductor memory device. The column select line enable signal PCSLE is activated when the timing control signal PYE is active and either internal clock signal PCLKCD or the output signal of the pulse generator 320 is active. The logic unit 330 is comprised of NAND gates 331 and 332. The NAND gate 331 performs an AND operation on the timing control signal PYE and the internal clock PCLKCD and inverts the result. The NAND gate 332 performs an AND operation on the output of the NAND gate 331 and the output of the pulse generator 320 and inverts the result, thereby generating the column select line enable signal PCSLE.

In operation, the circuit of FIG. 6 generates a pulse in the column select line enable signal PCSLE as soon as the timing control signal PYE is activated, regardless of the state of the internal clock signal PCLKCD, i.e., even if PCLKCD goes low before PYE is activated. Thus, the column select line enable signal PCSLE is activated for the first bit of a sequence of output data even if t1 is too long for tRCD.

The delay time period t1 is fully determined on the basis of the activation time of a word line. The activation time of a word line is determined by the decoding speed of a row address. Also, the capacitance of a memory cell, the capacitance of a bit line, and the performance of a bit line sense amplifier are other factors which determine the time delay t1.

Figure 7:
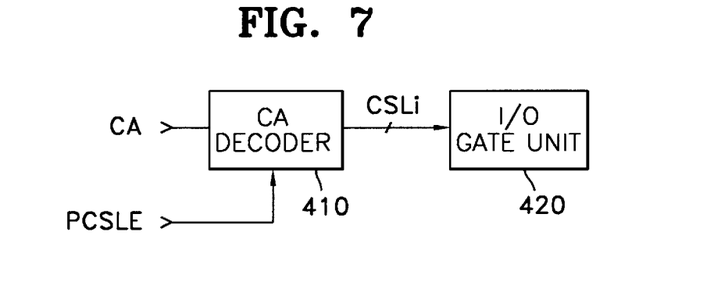
FIGS. 7 and 8 are schematic diagrams that illustrate the manner in which the circuit of FIG. 6 interfaces to column decoders and gate units in an SDRAM device having various numbers of banks.
Figure 8:
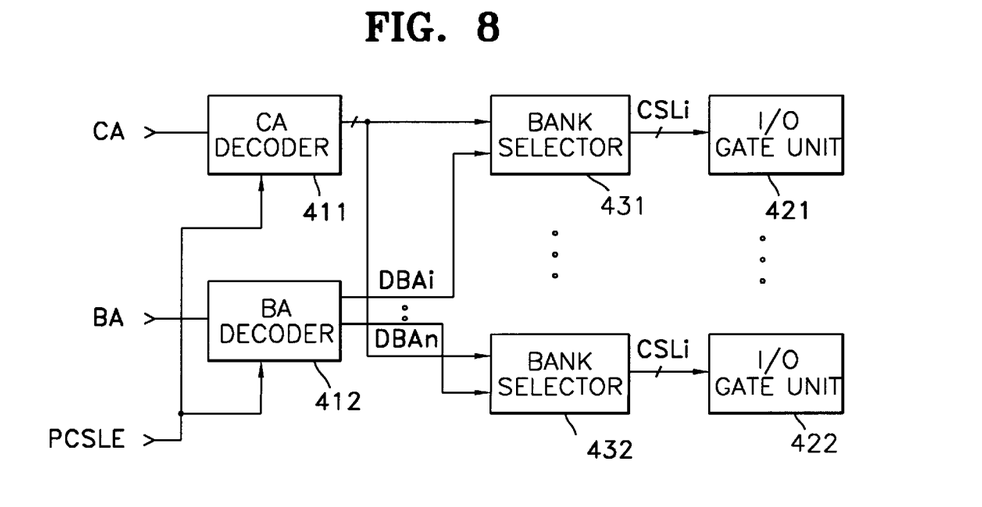

FIGS. 7 and 8 are schematic diagrams that illustrate the manner in which the circuit of FIG. 6 interfaces to column decoders and gate units in an SDRAM device having various numbers of banks. The semiconductor memory device of FIG. 7 includes one bank. A column address CA is input from the outside of the semiconductor memory device. The column address CA is buffered and then applied to a column address decoder 410. The column address decoder 410 decodes the column address and outputs the same when the column select line enable signal PCSLE is active. When the column select line enable signal PCSLE is inactive, the column select line signals CSLi output from the column address decoder 410 are all disabled. When the column select line enable signal PCSLE is active, one of a plurality of column select line signals CSLi is selectively activated. The column select line signals CSLi are applied to an input/output gate unit 420. The input/output gate unit 420 includes a plurality of input/output gates, and each column select line signal controls one input/output gate.

FIG. 8 shows a semiconductor how a cell array in a memory device is interfaced to receive the column select line enable signal PCSLE in a semiconductor memory device that includes a plurality of banks. A column address CA is applied to a column address decoder 411 and a bank address BA is applied to a bank address decoder 412. The column address decoder 411 decodes the column address CA and outputs the same when the column select line enable signal PCSLE is active. When the column select line enable signal PCSLE is inactive, the outputs of the column address decoder 411 are all disabled. The bank address decoder 412 decodes the bank address BA and outputs the same when the column select line enable signal PCSLE is active. When the column select line enable signal PCSLE is inactive, the outputs of the bank address decoder 412 are all disabled.

The outputs of the column address decoder 411 are applied to the respective bank selectors 431 and 432. The outputs of the bank address decoder 412 are applied to the respectively corresponding bank selector 431 and 432. In other words, the decoded bank address signal DBA1 is applied to a bank selector 431 and the decoded bank address signal DBAn is applied to the bank selector 432.

The respective bank selectors 431 and 432 output a plurality of column select line signals CSLi which are activated when the decoded bank address signal applied thereto is active and the decoded column address is active. Therefore, when the column select line enable signal PCSLE is active, only on column select line signal selected by the bank address column address is activated.

The input/output gate units 421 and 422 include a plurality of input/output gates. One input/output gate is controlled by each column select line signal. If the column select line signal is active, the input/output gate is turned on. If the column select line signal is inactive, the input/output gate is turned off.

Figure 9:
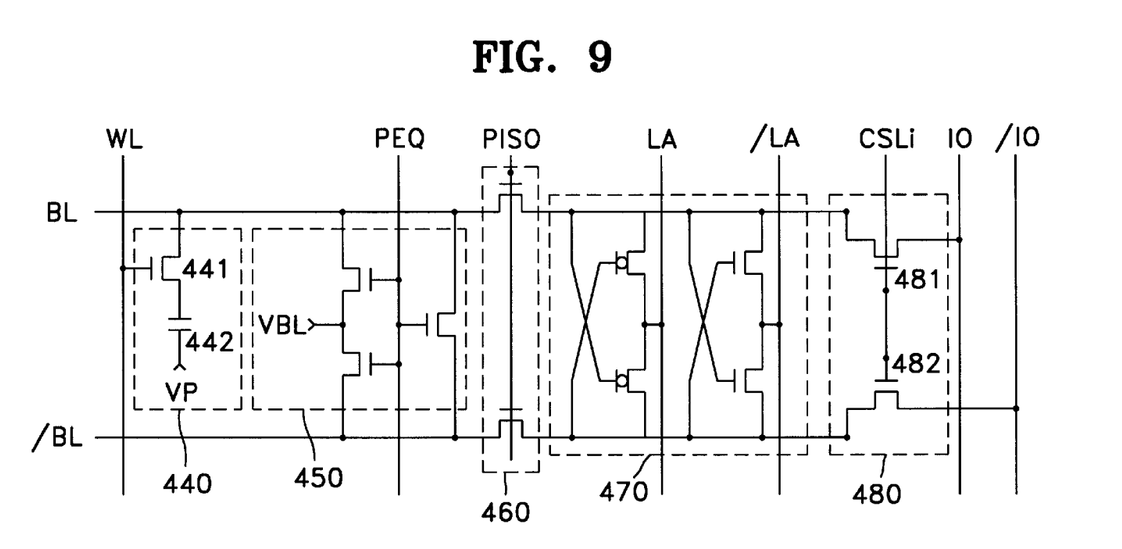
FIG. 9 is a schematic diagram showing how a memory cell array is interfaced to the gate units of FIGS. 7 and 8.

FIG. 9 is a schematic diagram showing how a memory cell array is interfaced to the gate units of FIGS. 7 and 8.

Referring to FIG. 9, a memory cell 440 includes a transistor 441 and a capacitor 442. A plate voltage VP is applied to the capacitor 442, and the gate of the transistor 441 is connected to a word line WL. Thus, if the word line WL is activated, the voltages of a bit line BL and an inverted bit line /BL vary depending on the data stored at both ends of the capacitor 442. If an equalizing signal PEQ is activated, the voltage levels of the bit line BL and inverted bit line /BL are equalized by an equalizer 450. A voltage signal VBL having a voltage level that is one-half that of the power source voltage is applied to the equalizer 450.

As shown in FIG. 9 an isolated gate unit 460 is always maintained in an "ON" state when the memory cell 440 is connected to only one end of a sense amplifier 470. However, the semiconductor memory device is generally constructed such that one sense amplifier is shared by a plurality of memory cells. Unlike in FIG. 9, the memory cells are connected to both ends, (e.g., left and right sides) of the sense amplifier 470. In such a case, in order to isolate the sense amplifier 470 from the memory cell 440, the isolate gate unit 460 is connected such that the left isolated gate unit is connected between the left memory cell array and the sense amplifier and the right isolated gate unit is connected between the right memory cell array and the sense amplifier. In order to reduce the load of the bit line, the left and right isolate gates operate in the following manner during a bit line sensing operation. During a pre-charge operation, the left and right isolate gates are both turned on. When a word line is enabled, that is, when an access operation is performed on a memory cell, if the accessed memory cell belongs to the left memory cell array, the right isolated gate unit is turned off and the left isolated gate unit is maintained in an "ON" state. If the accessed memory cell belongs to the right memory cell array, the left isolated gate unit is turned off and the right isolate gate unit is maintained in an "ON" state.

The operation of the sense amplifier 470 is controlled by control signals LA and /LA, and amplifies level transition of bit line BL and inverted bit line /BL depending on the data read from the cells.

After the bit line sensing amplification is performed, if the column line select signal is activated to a "high" level, the NMOS transistors 481 and 482 comprising the input/output gate 480 are turned on so that the voltage levels of the input/output line IO and the inverted input/output line /IO change to levels that depend on the voltage levels of the bit line BL and the inverted bit line /BL.

The column select line enable circuit of a semiconductor memory device generates signals for controlling a column select line to be selected. The column select line is controlled by controlling the column address decoding and bank address decoding operations as described above with reference to FIGS. 7 and 8. Only when the column select line enable signal PCSLE is active do the column address decoded signal and the bank address decoded signal function as column select line signals which are then applied to the respective input/output gates.

Figure 10:
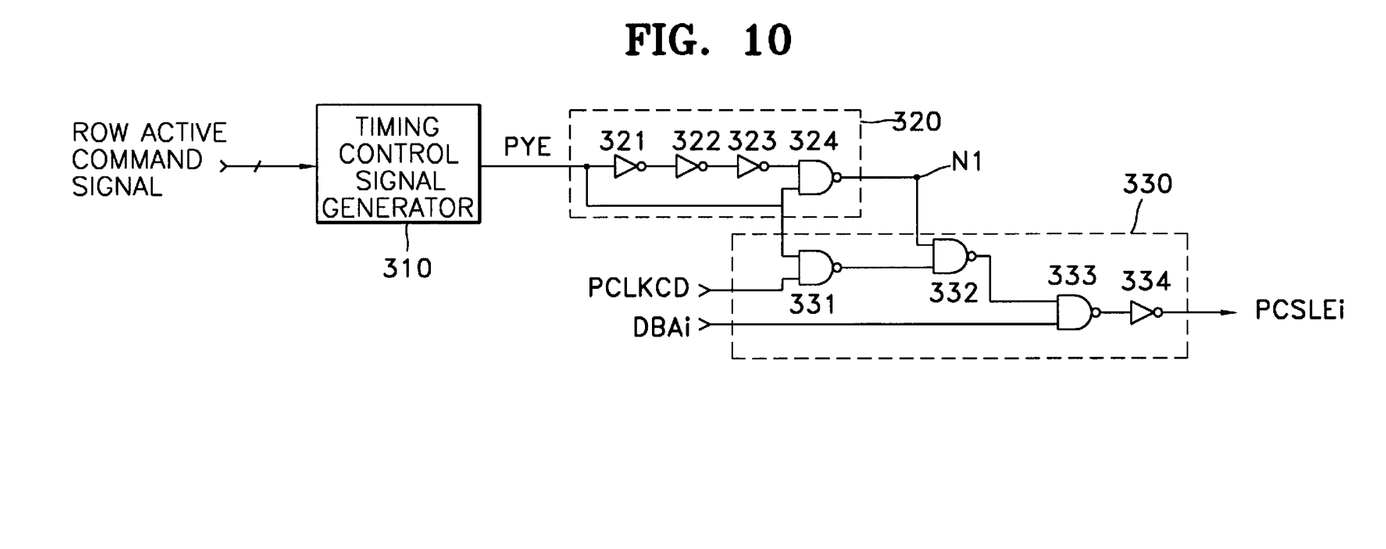
FIG. 10 is a schematic diagram of a second embodiment of a column select line enable circuit constructed in accordance with the present invention.

FIG. 10 is a schematic diagram of a second embodiment of a column select line enable circuit constructed in accordance with the present invention. The circuit of FIG. 10 includes a timing control signal generator 310, a pulse generator 320 and a logic unit 330.

The timing control signal generator 310 generates a timing control signal PYE which is activated a predetermined period of time (t1) after the row active command is applied. As with the circuit of FIG. 6, the row active command signal for the circuit of FIG. 10 can be composed of a combination of the least one signal applied from the outside of the semiconductor memory device.

The pulse generator 320 generates a pulse signal which is triggered by the activation of the timing control signal and which is activated for a predetermined period of time. The pulse generator 320 includes a plurality of inverters 321, 322 and 323 and an NAND gate 324, as shown in FIG. 10. The plurality of inverters 321, 322 and 323 delay the timing control signal PYE and output a delayed timing control signal. The number of the serially connected inverters is preferably adjusted so that the width of the pulse output from the pulse generator 320 is about 90~110% of that of the pulse width of the internal clock signal PCLKCD of the semiconductor memory device. The NAND gate 324 performs an AND operation on the delayed timing control signal and the timing control signal PYE, inverts the result, and outputs the same. Reference designator N1 denotes the output node of the pulse generator 320 from which the pulse signal is output.

Alternatively, the pulse generator 320 can include delay elements for delaying the timing control signal PYE and logic gates for performing AND operations with respect to the outputs of the delay elements and the timing control signal PYE.

The logic unit 330 generates a column select line enable signal PCSLE responsive to the internal clock PCLKCD which is generated inside of the semiconductor memory device, as well as the timing control signal PYE and the decoded bank address signal DBAi. The column select line enable signal PCSLE is activated when the timing control signal PYE and decoded bank address signal DBAi are active and either the internal clock signal PCLKCD or the output pulse signal of the pulse generator 320 is active.

According to a first embodiment of the logic unit 330 shown in FIG. 10, the logic unit 330 includes NAND gates 331, 332 and 333 and an inverter 334. The NAND gate 331 performs an AND operation on the timing control signal PYE and the internal clock PCLKCD and inverts the result. The NAND gate 332 performs an AND operation on the output of the pulse generator 320 and the output of NAND gate 331 and inverts the result. The NAND gate 333 performs an AND operation on the decoded bank address signal DBAi and the output of NAND gate 332 and inverts the result. The inverter 334 inverts the output of the NAND gate 333 and outputs the column select line enable signal PCSLEi. One of the column select line enable circuits shown in FIG. 10 is included for each bank in the semiconductor memory device. Each column select line enable signal PCSLEi controls the column select lines of the corresponding bank.

The decoded bank address signal DBAi represents one of a plurality of decoded bank address signals. Assuming the semiconductor memory device has eight banks, the decoded bank address signal DBA1 is activated to a "high" level if a bank A is selected. If a bank B is selected, the decoded bank address signal DBA2 is activated to a "high" level, and so on.

Figure 11:
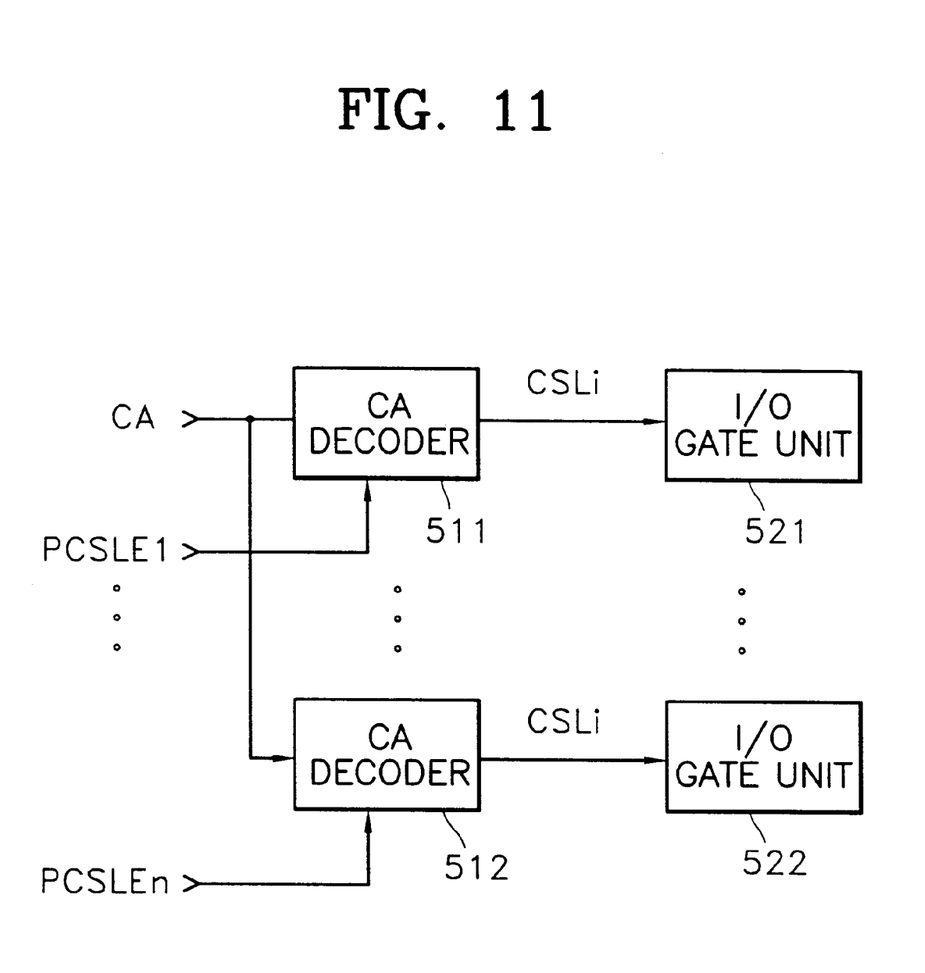
FIG. 11 is a schematic diagram that illustrates the manner in which the circuit of FIG. 10 interfaces to column decoders and gate units in an SDRAM.

FIG. 11 is a schematic diagram that illustrates the manner in which the circuit of FIG. 10 interfaces to column decoders and gate units in an SDRAM. Referring to FIG. 11, one of each of the column address decoders 511 and 512 and one of each of the input/output gates 521 and 522 correspond to each bank. A common column address is applied to the respective column address decoders 511 and 512 and the corresponding column select line enable signal PCSLEi is applied thereto. The column address decoder 511 is enabled when the column select line enable signal PCSLE1 is active, and performs a column address decoding operation. When the column select line enable signal PCSLE1 is inactive, the column address decoder 511 is disabled. Likewise, the column address decoder 512 is enabled when the column select line enable signal PCSLEn is active and performs a column address decoding operation. When the column select line enable signal PCSLEn is inactive, the column address decoder 512 is disabled. The rest of the column address decoders operate in the same manner.

The input/output gate units 521 and 522 include a plurality of input/output gates, respectively. Each of the respective input/output gates can include an NMOS transistor having a drain-source path connected between the bit line BL and the input/output line IO and a gate that receives the corresponding column select line signal CSLi. Each of the respective input/output gates can also include an NMOS transistor having a drain-source path connected between the inverted bit line /BL and the inverted input/output line /IO and a gate that receives the corresponding column select line signal CSLi, as shown in FIG. 9.

Figure 12:
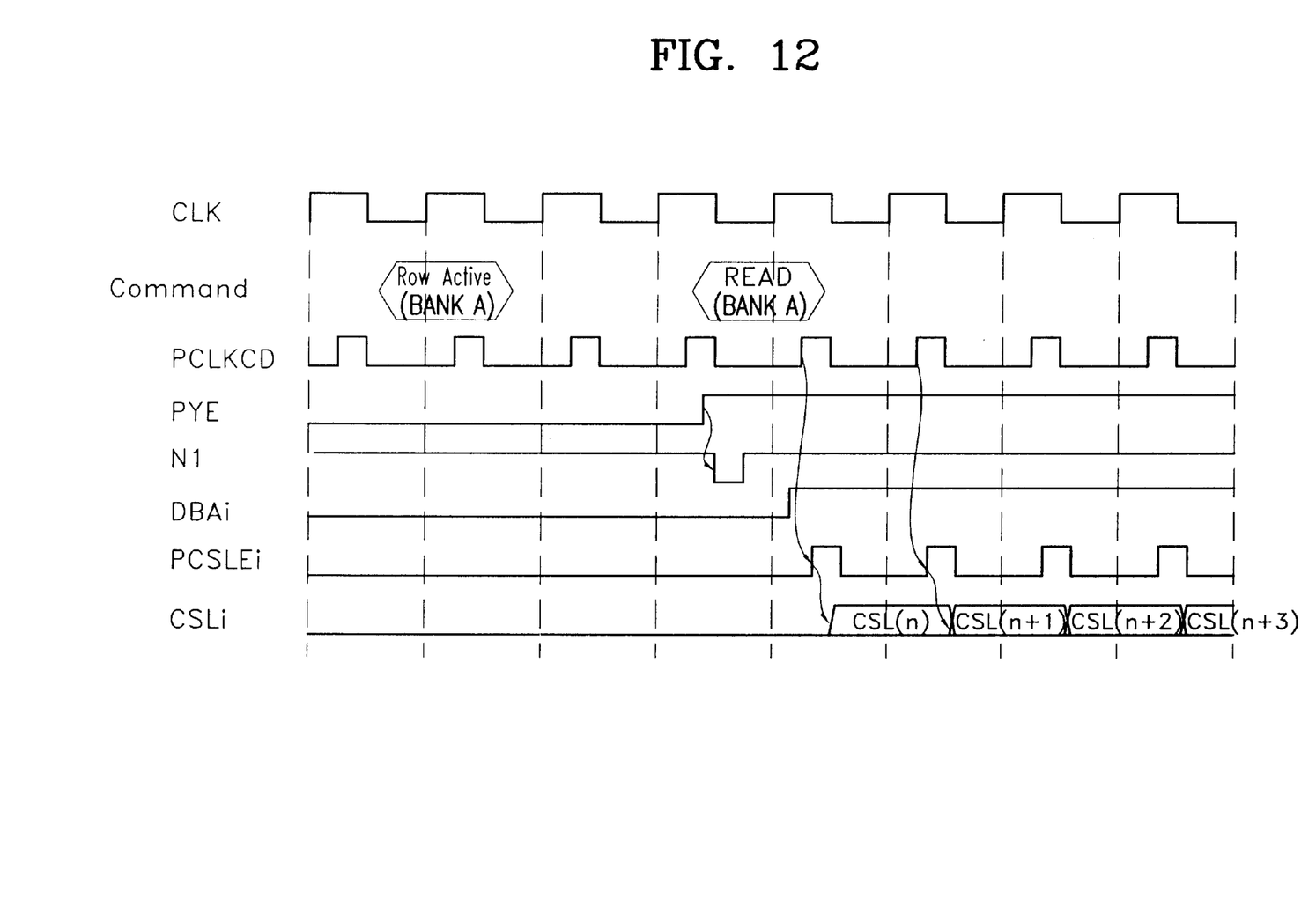
FIG. 12 is a timing diagram showing how the column select line enable circuit of FIG. 10 operates when the minimum tRCD for a memory device is satisfied.

FIG. 12 is a timing diagram showing how the column select line enable circuit of FIG. 10 operates when the minimum tRCD for a memory device is satisfied. A row active command and a read command are both input to the semiconductor memory device at rising edges of the system clock CLK. Assuming that tRCD calculated based on a predetermined time t1 required for performing a bit line sensing operation is 3 cycles, the read command is input 3 cycles after the row active command is applied. The timing control signal PYE is activated a predetermined time t1 after the row active command is input. The decoded bank address signal DBAi is activated a predetermined time after the read command is applied. The internal clock PCLKCD is a clock generated inside of the semiconductor memory device responsive to the system clock CLK.

As shown in FIG. 12, the column select line signals CSLi are sequentially activated according to the column select line enable signals PCSLEi during burst read mode, and all of the bits in the sequence of bits are read out of the memory device properly. Thus, the column select line enable circuit of FIG. 10 operates normally in a situation in which the tRCD parameter is satisfied when the read command is applied. The column select line signals CSLi are selectively activated according to the column address, bank address and column select line enable signal PCSLEi which are input together with the read command.

It should be noted that, although a "low" level active pulse is generated at the node N1 of FIG. 7, the pulse generated at node N1 does not affect the column select line enable signal PCSLEi in this case because the decoded bank address signal DBAi is not activated. Therefore, the column select line enable signal PCSLEi is affected only by the internal clock PCLKCD.

Figure 13:
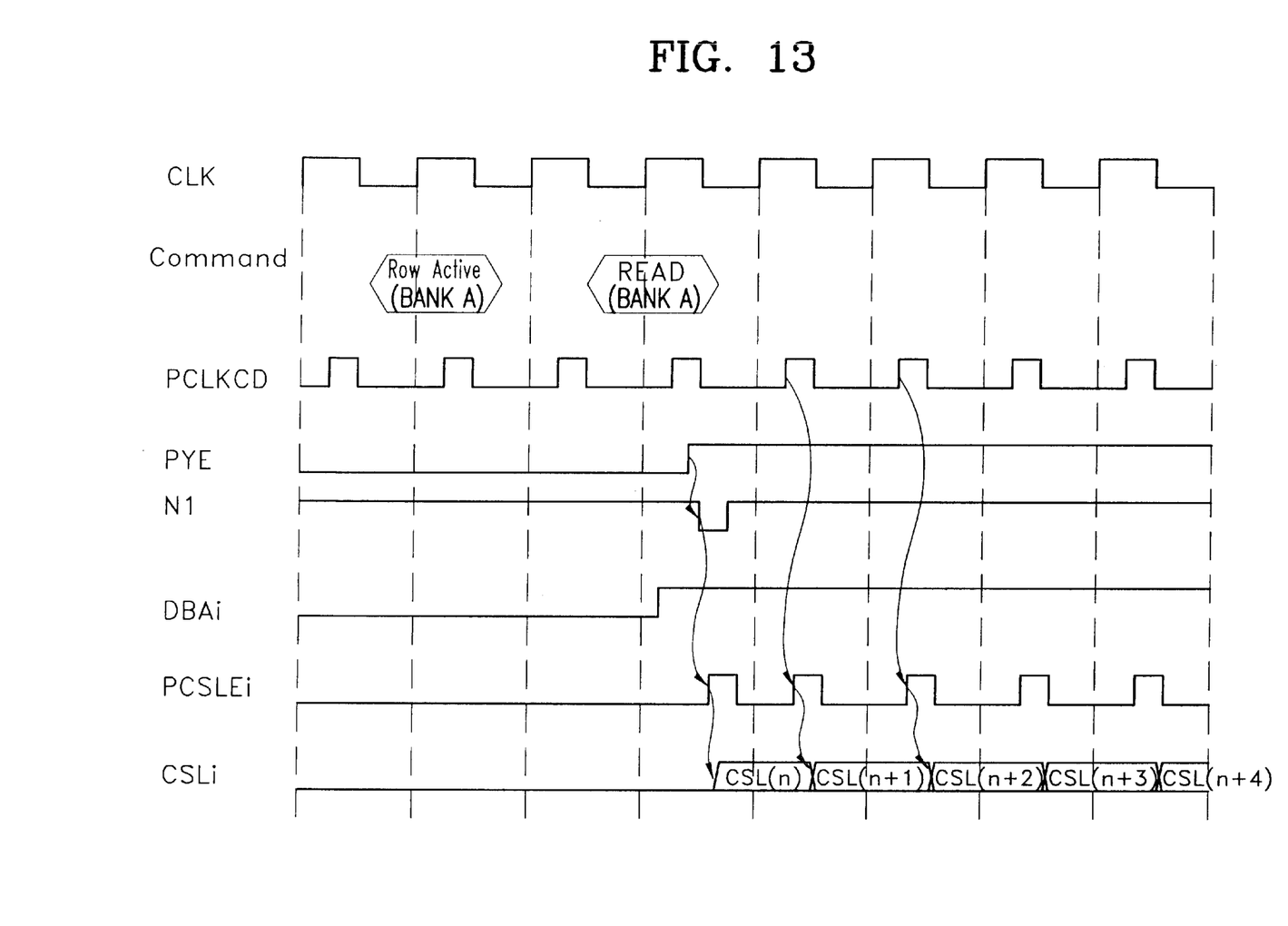
FIG. 13 is a timing diagram showing how the column select line enable circuit of FIG. 10 operates properly even when the minimum tRCD for a memory device is not satisfied.

FIG. 13 is a timing diagram showing how the column select line enable circuit of FIG. 10 operates properly even when the minimum tRCD for a memory device is not satisfied. Here, assuming that tRCD calculated based on a predetermined time t1 required for performing a bit line sensing operation in which the row active command is applied is 3 cycles of the system clock CLK, the read command is input 2 cycles after the row active command is applied. The timing control signal PYE is activated a predetermined time t1 after the row active command is input, which is the same time t1 as in FIG. 12. Since the decoded bank address signal DBAi is obtained by decoding the bank address input together with the read command, it is activated one cycle prior to the system clock CLK, unlike in FIG. 12. Here, since not only the bank address but also the column address are activated one cycle prior to the system clock CLK, active pulses must be generated in the column select line enable signal PCSLEi after the decoded bank address signal DBAi is activated. In FIG. 13, the first active pulse is generated in the column select line enable signal PCSLEi using the pulse from node N1. Therefore, the data read operation is performed properly even if tRCD is decreased. Thus, the tRCD parameter is reduced from 3 cycles to 2 cycles of the system clock CLK.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A method of controlling a column select enable line in a synchronous memory device that is synchronized by a first clock signal, the method comprising:

delaying a predetermined period of time after a row active command is applied to the memory device;

activating the column select enable line when the predetermined period of time is completed;

delaying a second predetermined period of time after the column select enable line is activated; and deactivating the column select enable line when the second predetermined period of time is completed; and activating and deactivating the column select enable line responsive to the first clock signal after the second predetermined period of time is completed.

2. The method according to claim 1 further including generating the first clock signal internally responsive to an external clock signal applied to the memory device.

3. The method according to claim 1 further including activating and deactivating the column select enable line only when a decoded bank address signal is active.

4. A column select line enable circuit for a synchronous memory device comprising:

a timing control signal generator for generating a timing control signal responsive to a row active command, wherein the timing control signal generator activates the timing control signal when a bit line sense operation is executed;

a pulse generator coupled to the timing control signal generator for generating a pulse signal responsive to the timing control signal; and a logic circuit coupled to the timing control signal generator and the pulse generator for generating a column select line enable signal responsive to the timing control signal and the pulse signal;

wherein the logic circuit activates the column select line enable signal when the timing control signal is active and either the pulse signal or a clock signal is active; and wherein the pulse generator includes:

a NAND gate having a first input terminal coupled to receive the timing control signal, a second input terminal, and an output terminal for transmitting the pulse signal; and an odd number of series connected inverters having an input terminal coupled to receive the timing control signal and an output terminal coupled to the second input terminal of the NAND gate.

5. The column select line enable circuit according to claim 4 wherein:

the pulse signal has a pulse width;

the clock signal has a pulse width; and the number of series connected inverters is selected so that the pulse width of the pulse signal is about 90–110 percent of the pulse width of the clock signal.

6. A column select line enable circuit for a synchronous memory device comprising:

a timing control signal generator for generating a timing control signal responsive to a row active command, wherein the timing control signal generator activates the timing control signal when a bit line sense operation is executed;

a pulse generator coupled to the timing control signal generator for generating a pulse signal responsive to the timing control signal; and a logic circuit coupled to the timing control signal generator and the pulse generator for generating a column select line enable signal responsive to the timing control signal and the pulse signal;

wherein the logic circuit activates the column select line enable signal when the timing control signal is active and either the pulse signal or a clock signal is active; and wherein the logic circuit includes:

a first NAND gate having a first input terminal coupled to receive the timing control signal, a second input terminal coupled to receive the clock signal, and an output terminal; and a second NAND gate having a first input terminal coupled to receive the pulse signal, a second input terminal coupled to the output terminal of the first NAND gate, and an output terminal for transmitting the column select line enable signal.

7. A column select line enable circuit for a synchronous memory device comprising:

a timing control signal generator for generating a timing control signal responsive to a row active command, wherein the timing control signal generator activates the timing control signal when a bit line sense operation is executed;

a pulse generator coupled to the timing control signal generator for generating a pulse signal responsive to the timing control signal; and a logic circuit coupled to the timing control signal generator and the pulse generator for generating a column select line enable signal responsive to the timing control signal and the pulse signal;

wherein the logic circuit activates the column select line enable signal when the timing control signal is active and either the pulse signal or a clock signal is active; and wherein the logic circuit includes:
- a first NAND gate having a first input terminal coupled to receive the timing control signal, a second input terminal coupled to receive the clock signal, and an output terminal; and
- a second NAND gate having a first input terminal coupled to receive the pulse signal, a second input terminal coupled to the output terminal of the first NAND gate, and an output terminal for transmitting the column select line enable signal.

8. A method of controlling a column select line enable signal in a synchronous memory device having an internal clock signal synchronized by an external clock signal, the method comprising:

delaying a first period of time after a row active command is applied to the memory device;

activating a timing control signal after the first period of time is completed;

activating a pulse signal for a second period of time after the first period of time is completed; and activating the column select line enable signal if the pulse signal is active or if the timing control signal and the internal clock signal are both active.

9. The method according to claim 8 further including only activating the column select line enable signal if a decoded bank address signal is active.

10. A column select line enable circuit for a synchronous memory device having an internal clock signal synchronized by an external clock signal, the circuit comprising:

a timing control signal generator for generating a timing control signal responsive to a row active command, wherein the timing control signal generator activates the timing control signal a first period of time after receiving the row active command;

a pulse generator coupled to the timing control signal generator for generating a pulse signal responsive to the timing control signal, wherein the pulse generator activates the pulse signal for a second period of time after the timing control signal is activated; and a logic circuit coupled to the timing control signal generator and the pulse generator, and coupled to receive the internal clock signal, wherein the logic circuit activates a column select line enable signal if the pulse signal is active or if the timing control signal and the internal clock signal are both active.

11. The column select line enable circuit according to claim 10 wherein:

the logic circuit is coupled to receive a decoded bank address signal; and the logic circuit only activates the column select line enable signal if the decoded bank address signal is active.

* * * * *